(12) United States Patent
Wang (10) Patent No.: US 8,013,406 B2
(45) Date of Patent: Sep. 6, 2011

(54) METHOD AND APPARATUS FOR GENERATING GIANT SPIN-DEPENDENT CHEMICAL POTENTIAL DIFFERENCE IN NON-MAGNETIC MATERIALS

(75) Inventor: Xiangrong Wang, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 229 days.

(21) Appl. No.: 12/346,456

(22) Filed: Dec. 30, 2008

(65) Prior Publication Data
US 2009/0179206 A1   Jul. 16, 2009

Related U.S. Application Data

(60) Provisional application No. 61/006,233, filed on Jan. 2, 2008.

(51) Int. Cl.
*H01L 29/82* (2006.01)

(52) U.S. Cl. .......... 257/421; 257/79; 257/422; 257/428; 257/659

(58) Field of Classification Search .............. 257/79, 257/421, 422, 428, 659
See application file for complete search history.

(56) References Cited

U.S. PATENT DOCUMENTS

| | | | |
|---|---|---|---|
| 5,432,373 A | 7/1995 | Johnson | |
| 5,565,695 A | 10/1996 | Johnson | |
| 5,629,549 A | 5/1997 | Johnson | |
| 5,654,566 A | 8/1997 | Johnson | |
| 6,480,365 B1 | 11/2002 | Gill et al. | |
| 6,532,164 B2 | 3/2003 | Redon et al. | |
| 6,603,677 B2 | 8/2003 | Redon et al. | |
| 6,753,562 B1 | 6/2004 | Hsu et al. | |
| 6,804,146 B2 | 10/2004 | Johnson | |
| 6,807,090 B2 | 10/2004 | Johnson | |
| 6,809,959 B2 | 10/2004 | Johnson | |
| 6,861,718 B2 | 3/2005 | Sato et al. | |
| 6,865,109 B2 | 3/2005 | Covington | |
| 6,975,533 B2 | 12/2005 | Johnson | |
| 6,985,385 B2 | 1/2006 | Nguyen et al. | |
| 7,050,329 B2 | 5/2006 | Johnson | |

(Continued)

OTHER PUBLICATIONS

Wang, X.R., Light Emitting Diodes of Inverse Spin Valves, Hindawi Publishing Corporation, Research letter in Physics, vol. 2008, Article ID 434936 (4 pages).

*Primary Examiner* — Tan N Tran
(74) *Attorney, Agent, or Firm* — Leydig, Voit & Mayer, Ltd.

(57) ABSTRACT

A system, structure, and method of making the structure are disclosed for generating a large chemical potential difference between spin-up and spin-down electrons in non-magnetic materials. The device includes an inverse spin valve of a sandwiched layer structure with alternating non-magnetic and magnetic layers. In an embodiment of the invention, the structure is a tri-layer device with a magnetic layer sandwiched by two non-magnetic metals. Once the inverse spin valve structure is provided, an external electric field is applied to the inverse spin valve to generate a large chemical potential difference between the spin-up and spin-down electrons. In an embodiment of the invention, this feature is exploited to create a tunable light emitting diode or laser. In an embodiment of the invention, a dynamical magnetism is induced and controlled in the valve by an electric field. The dynamical magnetization may be used as spin source, or in electronic storage devices.

10 Claims, 7 Drawing Sheets

U.S. PATENT DOCUMENTS

| | | |
|---|---|---|
| 7,057,921 B2 | 6/2006 | Valet |
| 7,068,535 B2 | 6/2006 | Johnson |
| 7,088,609 B2 | 8/2006 | Valet |
| 7,164,598 B2 | 1/2007 | Jeong et al. |
| 7,224,601 B2 | 5/2007 | Panchula |
| 7,272,034 B1 | 9/2007 | Chen et al. |
| 7,272,035 B1 | 9/2007 | Chen |
| 7,289,356 B2 | 10/2007 | Dia et al. |
| 7,307,299 B2 | 12/2007 | Koo et al. |
| 7,345,912 B2 | 3/2008 | Luo et al. |
| 7,379,327 B2 | 5/2008 | Chen et al. |
| 7,411,235 B2 | 8/2008 | Saito et al. |
| 7,816,746 B2 * | 10/2010 | Sato et al. .............. 257/421 |
| 2007/0206405 A1 * | 9/2007 | Lim et al. .............. 365/158 |

* cited by examiner

METHOD AND APPARATUS FOR GENERATING GIANT SPIN-DEPENDENT CHEMICAL POTENTIAL DIFFERENCE IN NON-MAGNETIC MATERIALS

CROSS-REFERENCE TO RELATED APPLICATIONS

This patent application claims the benefit of copending U.S. Patent Provisional Application No. 61/006,233, filed on Jan. 2, 2008, which is incorporated by reference in its entirety for all that it discloses, suggests, and incorporates, without exclusion of any portion thereof.

FIELD OF THE INVENTION

This invention relates generally to spintronic materials and systems, and, more particularly relates to a device for generating a large chemical potential difference between spin-up and spin-down electrons in a non-magnetic material.

BACKGROUND OF THE INVENTION

The conventional method to create an energy split between a spin-up electron and a spin-down electron in a non-magnetic material is through the Zeeman effect. In particular, electronic configurations that have the same energy can be split in a spin-dependent manner by the introduction of a sufficiently large magnetic field. However, due to the small value of Bohr magneton which defines the magnetic moment of electrons, the observed Zeeman split is generally very small. For example, a 10-Tesla field may cause an energy split of about 1 meV. To create a split of 1 eV, one would therefore need a field on the order of ten thousand Tesla.

Thus, a non-magnetic material is at most paramagnetic with small magnetic susceptibility. Furthermore, even if were possible to split the spin-up and spin-down electron levels by 1 eV via the Zeeman effect, it is still a challenge to create a 1 eV chemical potential difference between spin-up and spin-down electrons inside a material, since the laws of thermodynamics requires chemical potential to be the same at equilibrium.

Another possible way to generate a chemical potential difference inside a material is by applying an electrical bias, however it is difficult to apply a sufficiently large bias on a metal due to its conductivity. Although it may be possible to apply a large bias on a semiconductor or an insulator, this would tend to induce only a chemical potential difference between spatially separated electrons of the same spin. There is to date no device capable of generating a large chemical potential difference between the spin-up and spin-down electrons at the same location.

This Background section is intended to present ideas and concepts that the inventor feels will be of use in understanding the invention. This Background section is not intended to define or explain the prior art and is not intended to indicate that any technique or structure discussed in this section exists anywhere outside of the inventor's conception. Thus, the foregoing is not meant to capture and explain the prior art, but rather to present general ideas that may be of use to the reader in understanding the remainder of the document.

BRIEF SUMMARY OF THE INVENTION

Figure 1A:
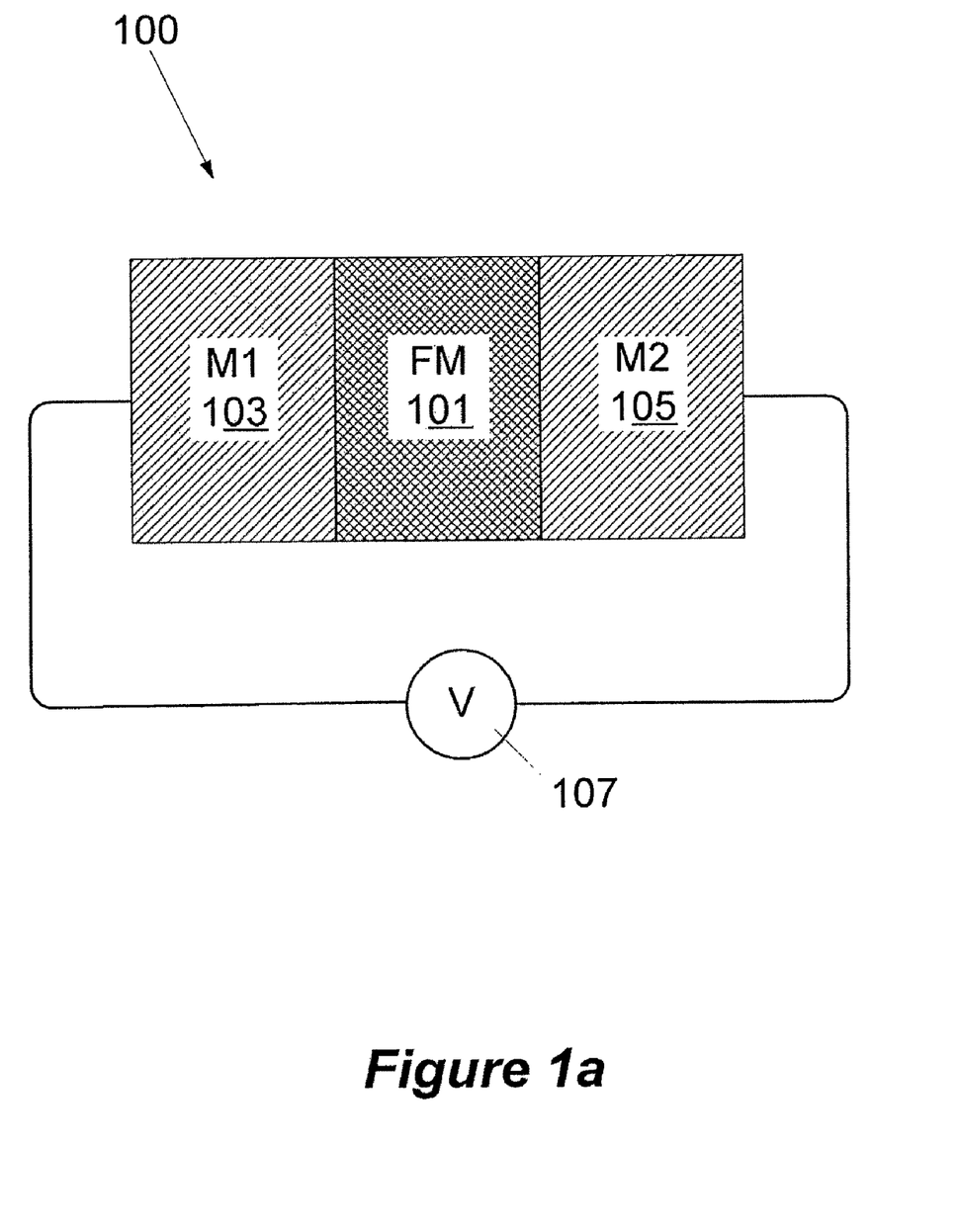
FIG. 1 is a simplified illustration of a selection of inverse spin valves according to embodiments of the invention, with (a) being a three-layer structure, non-magnetic materials, inorganic or organic metals or doped semiconductors sandwiching a magnetic layer, and (b) being a five-layer structure.
Figure 1B:
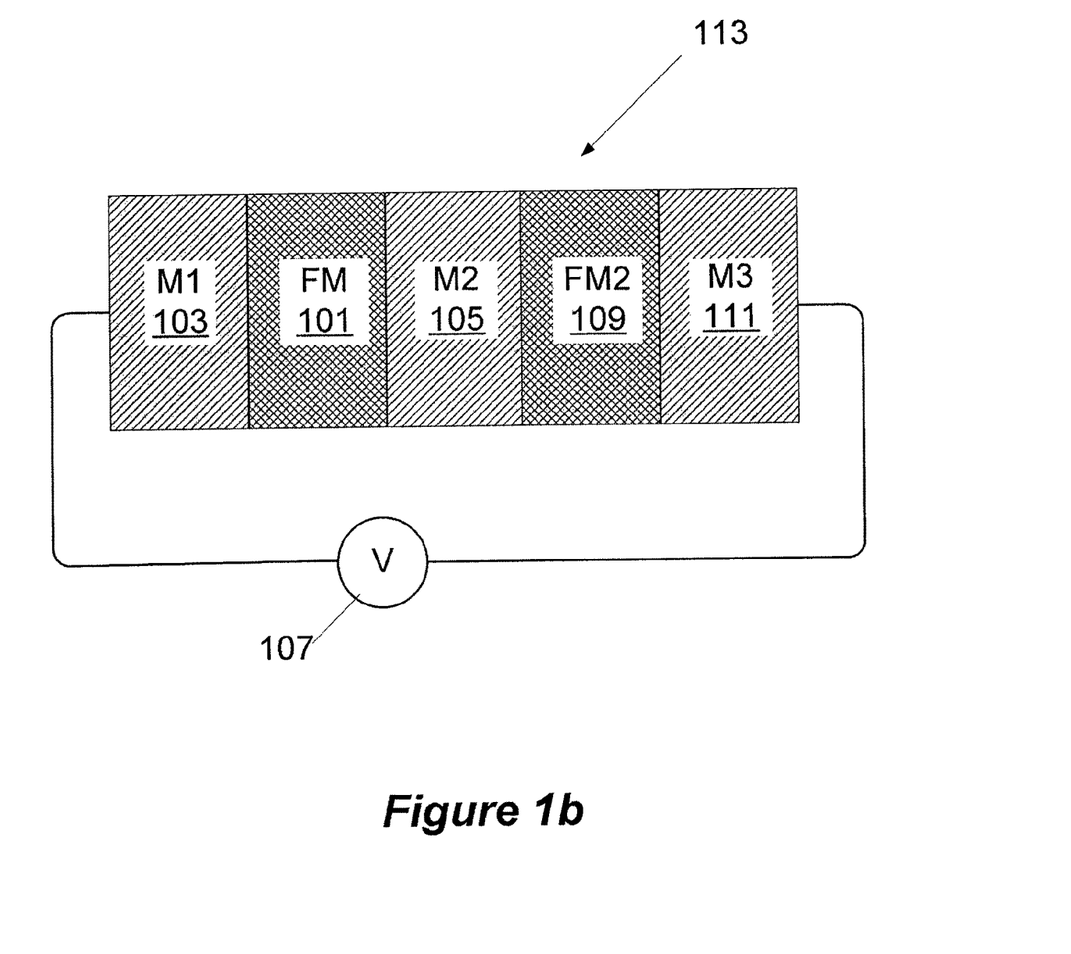

A conventional spin valve is a layered structure of a non-magnetic spacer material sandwiched by two ferromagnetic metals. The electron transport of a spin valve depends on the relative polarities of the two magnets. The present invention is in some sense an inversion of a conventional spin valve and may be referred to herein as an "inverse spin valve." An inverse spin valve is a layered structure as shown in FIG. 1. The simplest version, shown in FIG. 1a is a three-layer structure with a magnetic-layer (FM) sandwiched by two non-magnetic materials M1 and M2 (organic or inorganic metals or heavily doped semiconductors). To improve device performance, one may also increase the number of layers as indicated in FIG. 1b, where two more layers (FM2 and M3) are added.

The illustrated devices can, under a bias, create a chemical potential difference between spin-up and spin-down electrons in M1 and M2 near the M1-FM and M2-FM interfaces. This large spin-dependent chemical potential difference implies a large magnetization generation in a non-magnetic material by an electric field. It also means the generation of tunable light emission when the electrons so separated flip their spins and jump to lower energy levels. This invention is applicable to the provision of tunable light emitting diode and lasers, and also has useful application in spintronic devices to generate spin current and spin-polarized electric current. It can also used to create dynamical magnetization inside a non-magnetic material.

DETAILED DESCRIPTION OF THE INVENTION

It will be appreciated from the following description that a new and useful device and method of making same have been invented. In overview, the device allows the creation of a large chemical potential between spin-up and spin-down electrons via the application of an electrical bias across the device. Devices based on the disclosed principles may be used in the generation of tunable light emitting diode and lasers, and also has useful application in spintronic devices to generate spin current and spin-polarized electric current. It can also be used to create dynamical magnetization inside a non-magnetic material, transforming a non-magnet into a magnet under a bias.

Referring now more particularly to the drawings, in FIG. 1a, there is shown a basic version of the inverse spin valve 100. This structure 100 includes three layers including a magnetic-layer FM 101 sandwiched by two non-magnetic materials M1 103 and M2 105. The non-magnetic materials M1 103 and M2 105 may comprise organic or inorganic metals or heavily doped semiconductors. A voltage source 107 imposes a bias V across the structure 100. Alternatively, and without departing from the disclosed principles, the device performance may be improved by increasing the number of layers as indicated in the device 113 of FIG. 1b, where two additional layers FM2 109 and M3 111 have been added.

Figure 2A:
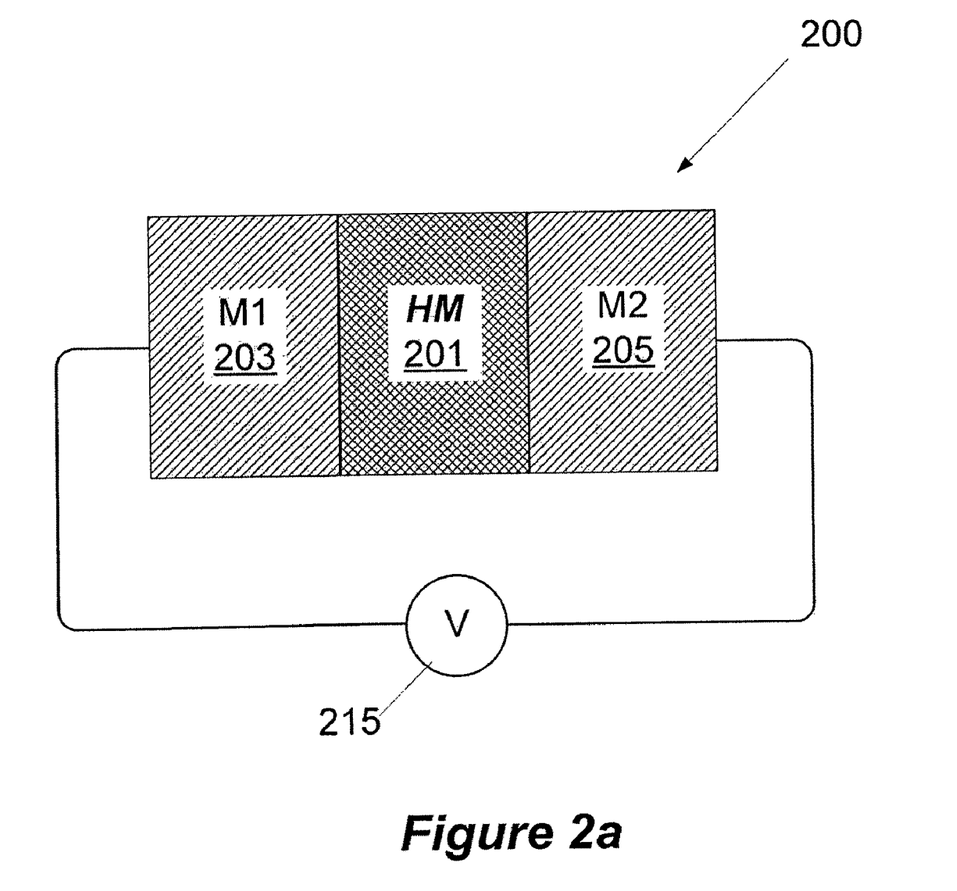
FIG. 2a. is a simplified schematic of an inverse spin valve according to an embodiment of the invention.

The working principle of the invention may be better understood by referring to the more specific example illustrated in FIG. 2a. In this example, the inverse spin valve 200 is a three-layered structure as in FIG. 1a, but wherein the magnetic-layer HM 201 is chosen to be a half-metal (HM) so that only electrons of one type of spins (spin-up) can pass through it. The magnetic-layer HM 201 is sandwiched by two non-magnetic metals M1 203 and M2 205.

It may be appreciated that the electron density of states (DOS) of a non-magnetic metal does not depend upon electron spin. Thus both spin-up (SU) and spin-down (SD) electrons have the identical DOS. This is depicted schematically in FIG. 2b, with the DOS of SU electrons shown by region 207, and the DOS of SD electrons shown by region 209. The DOSs of SU and SD electrons for a half-metal are illustrated in the middle of the diagram via regions 211 and 213 respectively.

Figure 2B:
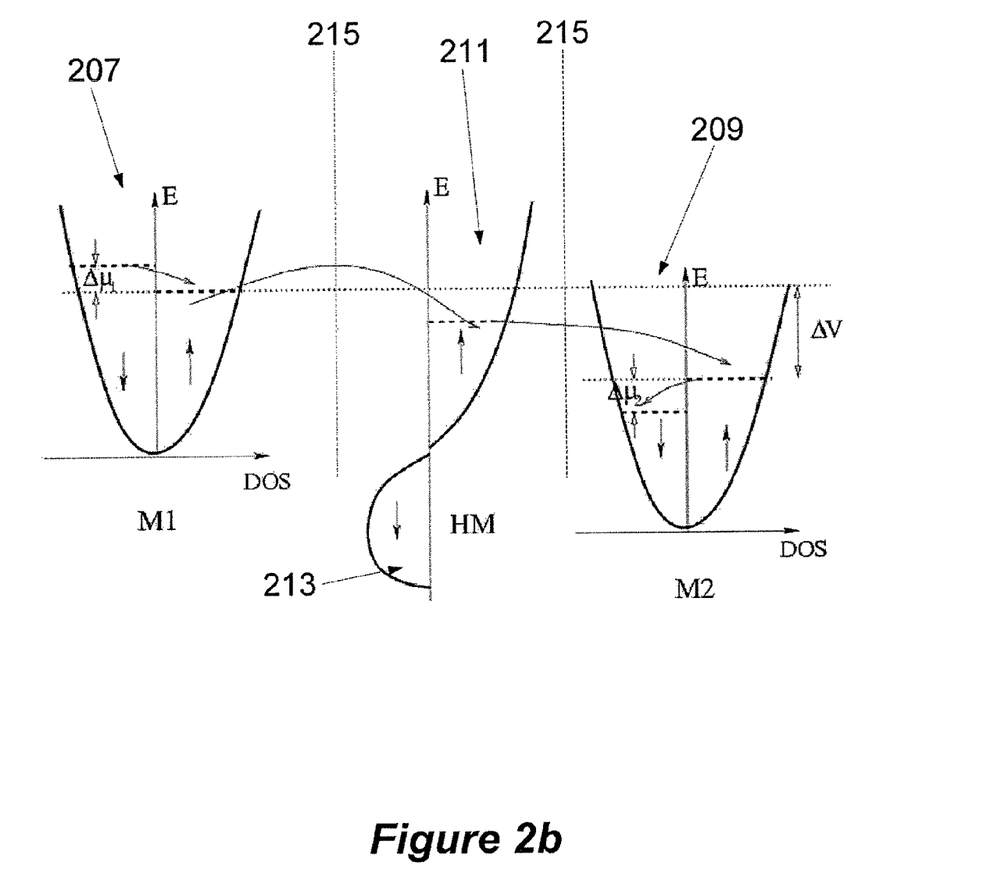
FIG. 2b is an energy diagram of an inverse spin valve according to an embodiment of the invention showing the relative chemical potentials of spin-up and spin-down electrons in nonmagnetic metals and half-metal.

Under a bias V supplied by a voltage source 215, SU electrons in M1 203 flow into the empty SU electron states in M2 205 via the empty SU electron states in the half-metal HM 201, shown pictorially by the curved arrows in FIG. 2b. The flow of the electrons creates chemical potential differences $\Delta\mu_1$ and $\Delta\mu_2$ respectively between SU and SD electrons in both M1 203 and M2 205 near the M1-HM 215 and M2-HM 217 interfaces respectively.

In order to understand why the chemical potentials of SU and SD electrons at the M1-HM 215 and M2-HM 217 interfaces split under an electrical bias, consider an extreme example in which spin relaxation times in both M1 203 and M2 205 are infinitely long (i.e., there is no spin relaxation, so that SU and SD electrons are isolated from each other). Initially, SU electrons flow into the empty SU electron states in M2 205 because the half-metal 201 prevents SD electrons from flowing. An equivalent amount electrons will be pumped back from M2 205 to M1 203 by the voltage source 213 to keep the electron neutrality in M1 203 and M2 205.

However, the voltage source 213 does not distinguish electron spin, and it pumps equal amount of SU and SD electrons. In other words, SU electrons flow out of M1 203 and into M2 205 via the half-metallic spacer 201. In the meanwhile, an equal amount of electrons with half of them in SU state and the other half in SD state are drawn out of M2 205 and supplied into M1 203 by a the voltage source 213. As a result, more SD electrons accumulate in M1 203 and more SU electrons are in M2 205. Thus, the chemical potential of the SD electrons will be higher than that of SU electrons in M1 203. Vice versa, the chemical potential of the SU electrons will be higher than that of SD electrons in M2 205. The chemical potential splits keep increasing until the chemical potential of SU electrons in M1 203 equals that in M2 205. At this point, the equilibrium zero current state is reached and chemical potential splits in M1 and M2 are established with $\Delta\mu_1 + \Delta\mu_2 = eV$.

In reality, spin relaxation always exists, and the magnitude of the chemical potential split for SU and SD electrons will be strongly dependent on the nature of the spin relaxation. This sensitivity can be seen from another example wherein the spin flipping is assumed to be so fast that SU and SD electrons are converted into each other anytime at no cost, and are thus at equilibrium with respect to each other at all times in M1 203 and M2 205. In this example, it would be impossible to create any chemical potential difference for SU and SD electrons in M1 203 and M2 205.

In reality, the actual nature of the spin relaxation lies somewhere in between these two extreme cases. The spin relaxation time of a real material is finite, and it depends on the strength of spin-orbital coupling, hyperfine interaction and other interactions caused by spin flipping. To include the spin relaxation time quantitatively, consider the zero temperature case. In this case, spin flip occurs only near the interfaces 215, 217 within a width of spin diffusion length $\xi_1$ in M1 203 and $\xi_2$ in M2 205. Assume the resistance of the half-metal be R (for SU electrons, the resistance for SD electrons is infinity due to the half-metallic nature of the middle spacer).

Figure 3:
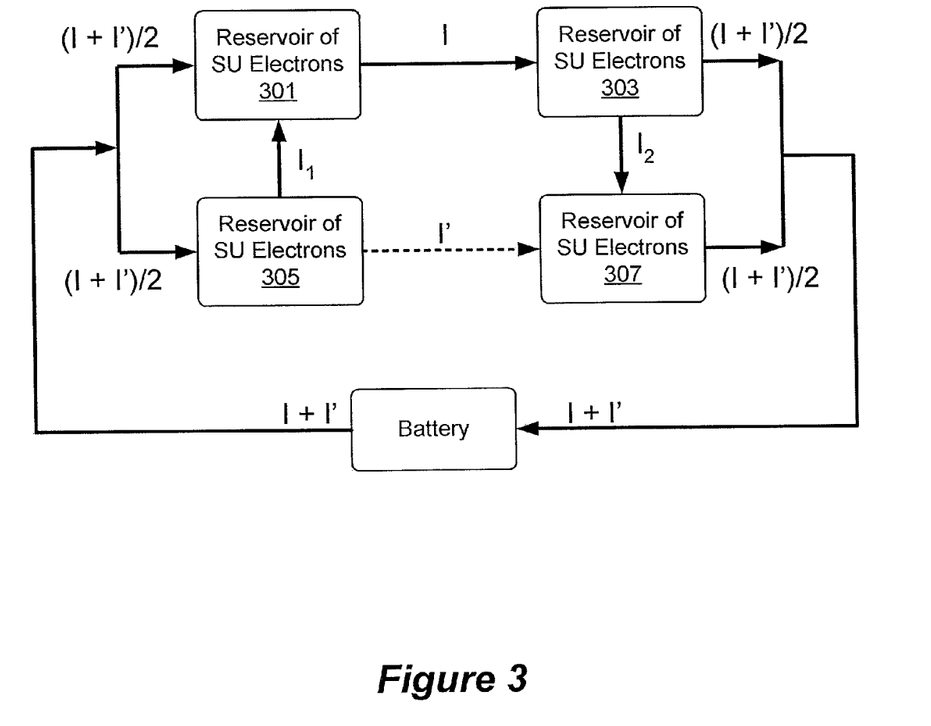
FIG. 3 is a schematic circuit illustration of current flow from and into spin-up and spin-down states within a device according to an embodiment of the invention.

The equations of the motion of the device can be obtained by considering electron flow as illustrated in the diagram 300 of FIG. 3. There are two reservoirs in each of M1 203 and M2 205. A first 301, 303 is for SU electrons, and a second 305, 307 is for SD electrons. SU electrons in M1 can flow into SU electron reservoir of M2. The current I depends on resistance and chemical potential difference $\Delta V$ of SU electrons in M1 203 and M2 205 according to:

$$I = \Delta V / R \tag{1}$$

Neglecting direct tunneling of SD electron from M1 203 to M2 205 through the half-metal 201, SD electrons can only go to M2 205 by first flipping their spins and converting themselves into SU electrons. Let $\tau_1$ and $\tau_2$ be the spin flipping time in M1 203 and M2 205, corresponding to the flipping rate of $1/\tau_1$ and $1/\tau_2$ respectively. Due to the conversion of SD electrons to SU electrons, the current from SD reservoir to SU reservoir in M1 is $$I_1 = \frac{n_1 \Delta \mu_1 e \xi_1 A}{\tau_1}, \tag{2}$$

where $n_1$ is the density of states of SD electrons in M1 203 at the Fermi level. The value A is the cross section of M1 203. Similarly, the current due to the conversion of SU electrons to SD electrons in M2 205 is $$I_2 = \frac{n_2 \Delta \mu_2 e \xi_2 A}{\tau_2}, \tag{3}$$

where $n_2$ is the density of states of SD electrons in M2 205 at the Fermi level. At the steady state, there is no net electron build up anywhere in the circuit. Since the current through the battery is unpolarized, spin-up electrons will be mixed with spin-down electrons and be pumped by the voltage source 213 from M2 205 into M1 203. Thus, half of the current is made up by the SU electrons and the other half is from the SD electrons, and balance conditions require $$I_1 = I/2,$$

$$I_2 = I/2,$$

$$\Delta\mu_1/e + \Delta\mu_2/e + \Delta V = V. \qquad (4)$$

Solving Eqs. (1)-(4), the chemical potential split $\Delta\mu_1$ and $\Delta\mu_2$ respectively are:

$$\Delta\mu_1 = eV \frac{\tau_1/n_1 e^2 \xi_1 A}{2R + \tau_1/n_1 e^2 \xi_1 A + \tau_2/n_2 e^2 \xi_2 A}, \qquad (5)$$

$$\Delta\mu_2 = eV \frac{\tau_2/n_2 e^2 \xi_2 A}{2R + \tau_1/n_1 e^2 \xi_1 A + \tau_2/n_2 e^2 \xi_2 A}.$$

The largest chemical potential split occurs at R=0. Thus, a half-metal with good conducting property for the majority carriers and good insulating property for the minority carriers is preferred.

The half-metal may be replaced by a usual ferromagnetic metal. In this case, SD electrons in M1 203 can also flow directly into M2 205, contributing an extra current I' to the circuit $$I' = V/R', \qquad (6)$$

where R' is the resistance of the ferromagnet for SD electrons. Without loss of generality, SD electrons are assumed to be the minorities of the ferromagnet, and R' is larger than R. The chemical potential difference of SD electrons in M1 203 and M2 205 equals V as it is shown in FIG. 2*b*, and Eq. (4) should be modified accordingly as $$I_1 = (I - I')/2,$$

$$I_2 = (I - I')/2,$$

$$\Delta\mu_1/e + \Delta\mu_2/e + \Delta V = V. \qquad (7)$$

This set of equations with non-zero I' can be solved, and the dynamical Zeeman split $\Delta\mu_1$ and $\Delta\mu_2$, in comparison with that of half-metal case, are reduced by a factor of 1−R/R'

$$\Delta\mu_1 = eV\left(1 - \frac{R}{R'}\right)\frac{\tau_1/n_1 e^2 \xi_1 A}{2R + \tau_1/n_1 e^2 \xi_1 A + \tau_2/n_2 e^2 \xi_2 A}, \qquad (8)$$

$$\Delta\mu_2 = eV\left(1 - \frac{R}{R'}\right)\frac{\tau_2/n_2 e^2 \xi_2 A}{2R + \tau_1/n_1 e^2 \xi_1 A + \tau_2/n_2 e^2 \xi_2 A}.$$

The prior results as in Eq. (5) are recovered when R=∞. Also, there are no chemical potential splits in M1 203 and M2 205 when the spacer is non-magnetic and R=R'. Therefore, a good half-metal (good conductor for the majorities and good insulator for the minority carriers) should be used if it is desired to maximize the split.

Figure 4:
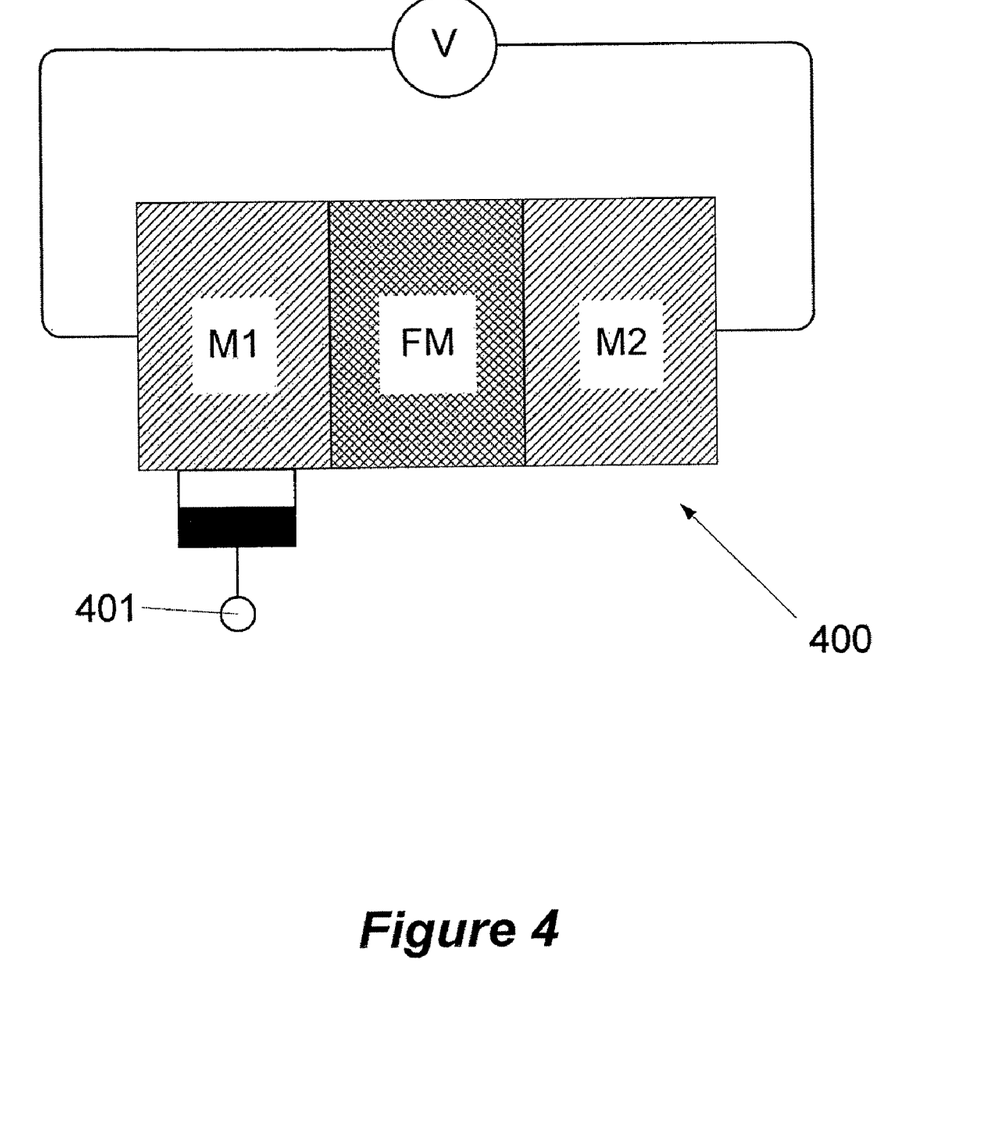
FIG. 4 is a schematic diagram of a structure according to an embodiment of the invention for spin injection from the large spin-dependent chemical potential difference generated in the inverse spin valve wherein the base voltage used to select and to control the type of electrons.

In an alternative embodiment of the invention, another lead 401 can be attached to the inverse spin valve 400 as shown schematically in FIG. 4. This device 400 may be used for spin injection from the large spin-dependent chemical potential difference generated in the inverse spin valve wherein the base voltage $V_b$ is used to select and to control the type of electrons.

Figure 5:
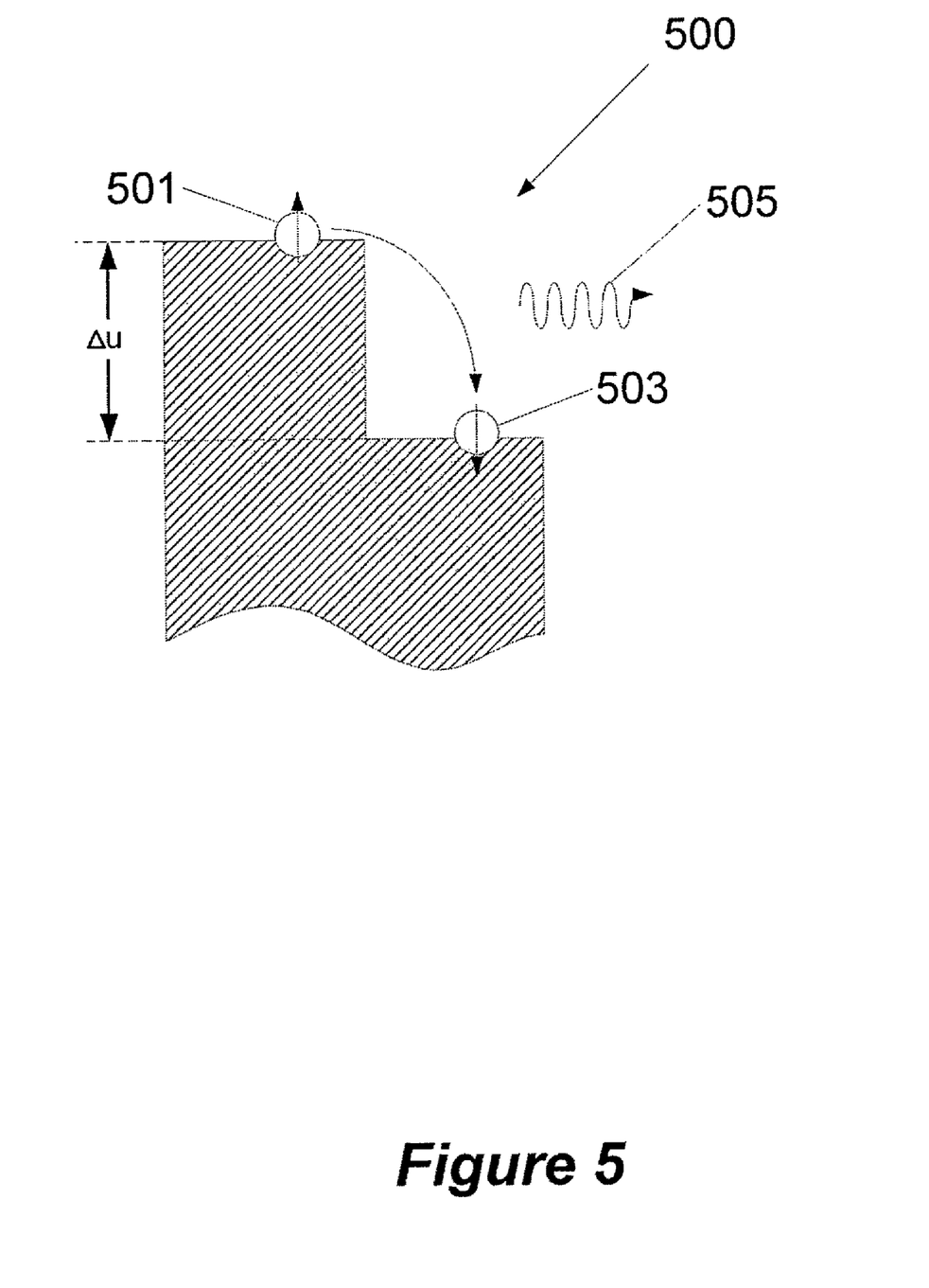
FIG. 5 is a schematic illustration of the light emitting process in a device according to an embodiment of the invention, wherein it is assumed that the chemical potential of spin-up electrons is higher than the chemical potential of spin-down electrons, and wherein the flipping of a spin-up electron emits a photon having energy essentially equivalent to the energy between states.

As noted above, it will be appreciated from this description and explanation that the inverse spin valve according to the disclosed principles may be used for the generation of photonic emission, whether visible or otherwise. In particular, as shown in the state diagram 500 of FIG. 5, spin-up electrons 501 may jump from that state to the empty spin-down electron states 503, and in so doing may emit a photon 505. In this way, the inverse spin valve can provide a light emitting diode (emitting non-coherent light) or laser (emitting coherent stimulated or amplified light). The advantage of this device over other approaches is that the light frequency can be tuned via the applied bias from the lowest possible frequency to the highest possible frequency.

Other applications that will be appreciated upon reading this disclosure include the creation of a dynamical magnetization. In particular, the large spin-dependent chemical potential difference that is created indicates that more electrons are in one type of spin than the other, thus providing a net total magnetization.

In a related vein, the invention can be used to make devices requiring electric-field-induced magnetism. Moreover, the invention can be used to make dynamical magnetic elements that can be switched on-and-off by an applied electric field. The dynamical magnet so constructed can be used in the place of conventional magnets in both electronic and spintronic devices. Moreover, the disclosed structure can be used to supply a dynamical memory cell.

Another application of the disclosed principles and structures stemming from the large chemical potential difference between spin-up and spin-down electrons means is that electrons can flip their spins by jumping to lower energy states and by emitting a photon with well defined polarization. Thus the disclosed structure is useful to create polarized-light emitting diodes. Furthermore, since the chemical potential difference can be tuned by the external bias, the light emitting diode so constructed is tunable from the lowest frequency into the visible light range if a split of several eV is applied.

Finally, it may be appreciated that the large spin-dependent chemical potential difference generated in non-magnetic materials can also be used as a source of spins and spin current.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A multi-layer device for generating an electrically induced large spin-dependent chemical potential difference comprising:
    a first layer of a nonmagnetic material, a second layer of a nonmagnetic material, and a third layer disposed between and contacting the first and second layers, the third layer being made of a magnetic material;
    a first terminal configured to contact the first layer and a second terminal configured to contact the second layer; and
    a voltage source for generating a voltage bias between the first and second terminals, such that in the substantial absence of an externally-applied magnetic field, a large spin-dependent chemical potential difference arises in the first and second layers between spin-up electrons and spin-down electrons.

2. The multi-layer device according to claim 1, wherein the device is configured such that recombination of spin-up and spin-down electrons occurs at a predetermined rate.

3. The multi-layer device according to claim 2, wherein the recombination of spin-up and spin-down electrons results in the emission of radiation.

4. The multi-layer device according to claim 3, wherein one or more characteristics of the emitted radiation are tunable via the applied voltage.

5. The multi-layer device according to claim 3, wherein the one or more characteristics of the emitted radiation include frequency.

6. The multi-layer device according to claim 1, wherein the first and second layers are constructed of a material selected from the group consisting of inorganic metals, organic metals, and doped semiconductors.

7. The multi-layer device according to claim 1, wherein the third layer is constructed of a half-metal material that is conductive to electrons of one spin orientation, but insulative to electrons of an opposite spin orientation.

8. The multi-layer device according to claim 1, further comprising a third terminal attached to the device via the first layer, whereby electron injection in the device is controllable by applying a bias voltage to the third terminal.

9. A multi-layer device for generating an electrically induced large spin-dependent chemical potential difference comprising:
    first second, and third layers of a nonmagnetic material;
    fourth and fifth layers of magnetic material, wherein the fourth layer is disposed between the first and second layers and the fifth layer is disposed between the second and third layers;
    a first terminal configured to contact the first layer and a second terminal configured to contact the third layer; and
    a voltage source for generating a voltage bias between the first and second terminals, such that in the substantial absence of an externally-applied magnetic field, a large spin-dependent chemical potential difference arises in the first, second and third layers between spin-up electrons and spin-down electrons.

10. The multi-layer device according to claim 9, wherein the fourth and fifth layers of magnetic material are comprised of a half-metal material that is conductive to electrons of one spin orientation, but insulative to electrons of an opposite spin orientation.

* * * * *